(12) United States Patent
Segarra et al.

(10) Patent No.: US 11,448,690 B2
(45) Date of Patent: Sep. 20, 2022

(54) SCREENING METHOD AND APPARATUS FOR DETECTING DEEP TRENCH ISOLATION AND SOI DEFECTS

(71) Applicant: NXP USA, Inc., Austin, TX (US)

(72) Inventors: Laurent Segarra, Tournefeuille (FR); Maarten Jacobus Swanenberg, Berg en Dal (NL); Pierre Turpin, Toulouse (FR); Matthew Bacchi, Saveres (FR); Russell Schaller, Gilbert, AZ (US); Keith Jackoski, Chandler, AZ (US); Ronghua Zhu, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 17/352,695

(22) Filed: Jun. 21, 2021

(65) Prior Publication Data

US 2022/0003812 A1     Jan. 6, 2022

(30) Foreign Application Priority Data

Jul. 1, 2020  (EP) ..................................... 20305738

(51) Int. Cl.
*G01R 31/28* (2006.01)
*G01R 31/27* (2006.01)
*H01L 21/762* (2006.01)
*H01L 21/66* (2006.01)

(52) U.S. Cl.
CPC ....... *G01R 31/2853* (2013.01); *G01R 31/275* (2013.01); *G01R 31/2884* (2013.01); *H01L 21/76264* (2013.01); *H01L 22/14* (2013.01); *H01L 22/32* (2013.01)

(58) Field of Classification Search
CPC .............. G01R 31/2853; G01R 31/275; G01R 31/2884; G01R 31/2856; H01L 21/76264; H01L 22/14; H01L 22/32; H01L 22/30; H01L 22/34
USPC ...................................... 324/750.3, 537, 500
See application file for complete search history.

(56) References Cited

U.S. PATENT DOCUMENTS

| | | |
|---|---|---|
| 5,773,326 A | 6/1998 | Gilbert et al. |
| 6,245,600 B1 | 6/2001 | Geissler et al. |
| 6,410,962 B2 | 6/2002 | Geissler et al. |
| 6,489,800 B1 | 12/2002 | Dallavale |
| 7,298,159 B1 | 11/2007 | Rozario et al. |
| 8,455,949 B2 | 6/2013 | Gossner et al. |
| 9,305,916 B1 | 4/2016 | Cai et al. |
| 9,406,695 B2 | 8/2016 | Shapiro et al. |
| 10,115,837 B1 * | 10/2018 | Liu ........................ H01L 31/036 |

(Continued)

FOREIGN PATENT DOCUMENTS

CN          104835816 B       9/2017

*Primary Examiner* — Giovanni Astacio-Oquendo

(57) ABSTRACT

A testing method and apparatus is disclosed for testing an integrated circuit device (100) which has a dedicated ground bias pad (121) connected across a high voltage electrostatic discharge clamp circuit (123) to a well-driving ground pad (122) by applying a first voltage to the dedicated ground bias pad to bias a wafer substrate (101) while simultaneously applying a second voltage to the well-driving ground pad to bias the well region (103), where the first and second voltage create a stressing voltage across a buried insulator layer (102, 105) in the integrated circuit device so that a screening test can be conducted to screen for a defect (106) in the buried insulator layer by measuring a leakage current.

20 Claims, 4 Drawing Sheets

(56) References Cited

U.S. PATENT DOCUMENTS

| | | |
|---|---|---|
| 2001/0010964 A1 | 8/2001 | Geissler et al. |
| 2003/0113941 A1 | 6/2003 | Naruoka |
| 2010/0013016 A1 | 1/2010 | Shih et al. |
| 2015/0067429 A1 | 3/2015 | Edwards et al. |
| 2017/0133289 A1 | 5/2017 | Geitler et al. |
| 2017/0309524 A1* | 10/2017 | Saxena .................... G01B 7/08 |
| 2017/0358692 A1* | 12/2017 | Sun ..................... H01L 27/0811 |

* cited by examiner

SCREENING METHOD AND APPARATUS FOR DETECTING DEEP TRENCH ISOLATION AND SOI DEFECTS

CROSS-REFERENCE TO RELATED APPLICATIONS

This application claims the priority under 35 U.S.C. § 119 of European Patent application no. 20305738.5, filed on Jul. 1, 2020, the contents of which are incorporated by reference herein.

BACKGROUND OF THE INVENTION

Field of the Invention ne present invention is directed in general to the field of semiconductor devices. In one aspect, the present invention relates to defect testing of high-performance integrated circuit devices.

Description of the Related Art

Deep trench isolation (DTI) structures are well-known isolation structures that are used in semiconductor devices to isolate laterally adjacent regions of a substrate, epitaxial layer, or well from each other. DTI structures are typically formed by first etching a deep trench in the substrate or through an epitaxial layer into the substrate. Once formed, the trench is typically lined with one or more insulator layers (e.g., oxide), and then filled with a conductive material (e.g., polysilicon) to provide a conductive path from the surface to the underlying substrate. Other types of isolating structures include buried oxide (BOX) layers which are formed between an underlying wafer substrate and overlying substrate, epitaxial layer, or well. In such isolation structures, the insulating layers may be formed with unstressed oxides having foreign particles or cracks which form defects in the insulating layer. For example, a crack in a DTI structure creates an empty area with is subsequently filled with conductive polysilicon, thereby creating an unwanted electrical conduction path between an electrically isolated device and the substrate ground. Flaws can also present problems in the absence of other than a short. For example, another type of defect can arise when a local reduction of the DTI oxide thickness effectively lowers the rupture voltage of the isolation barrier. Similar defects can arise in the formation of the buried oxide layer used in semiconductor-on-insulator (SOI) substrates. While surface level defects in the DTI structures can be observed with visual inspection techniques, the visual inspection approach is not practical for production purposes and cannot identify underlying insulator defects in the substrate. Such undetected defects pose a quality risk because existing device test methods do not detect buried defects in the underlying DT and SOI structures. In additional to quality risks, undetected defects pose reliability risk because a thinner oxide may ultimately fail in the field, resulting in customer dissatisfaction. As seen from the foregoing, the existing solutions for detecting defects in DTI structures and/or SOI structures are extremely difficult at a practical level by virtue of the challenges with effectively screening for buried defects in DTI structures and/or SOI structures while meeting the performance requirements and cost constraints for mass production testing of semiconductor devices and avoiding the performance and reliability related problems associated with conventional testing solutions.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

Figure 1:
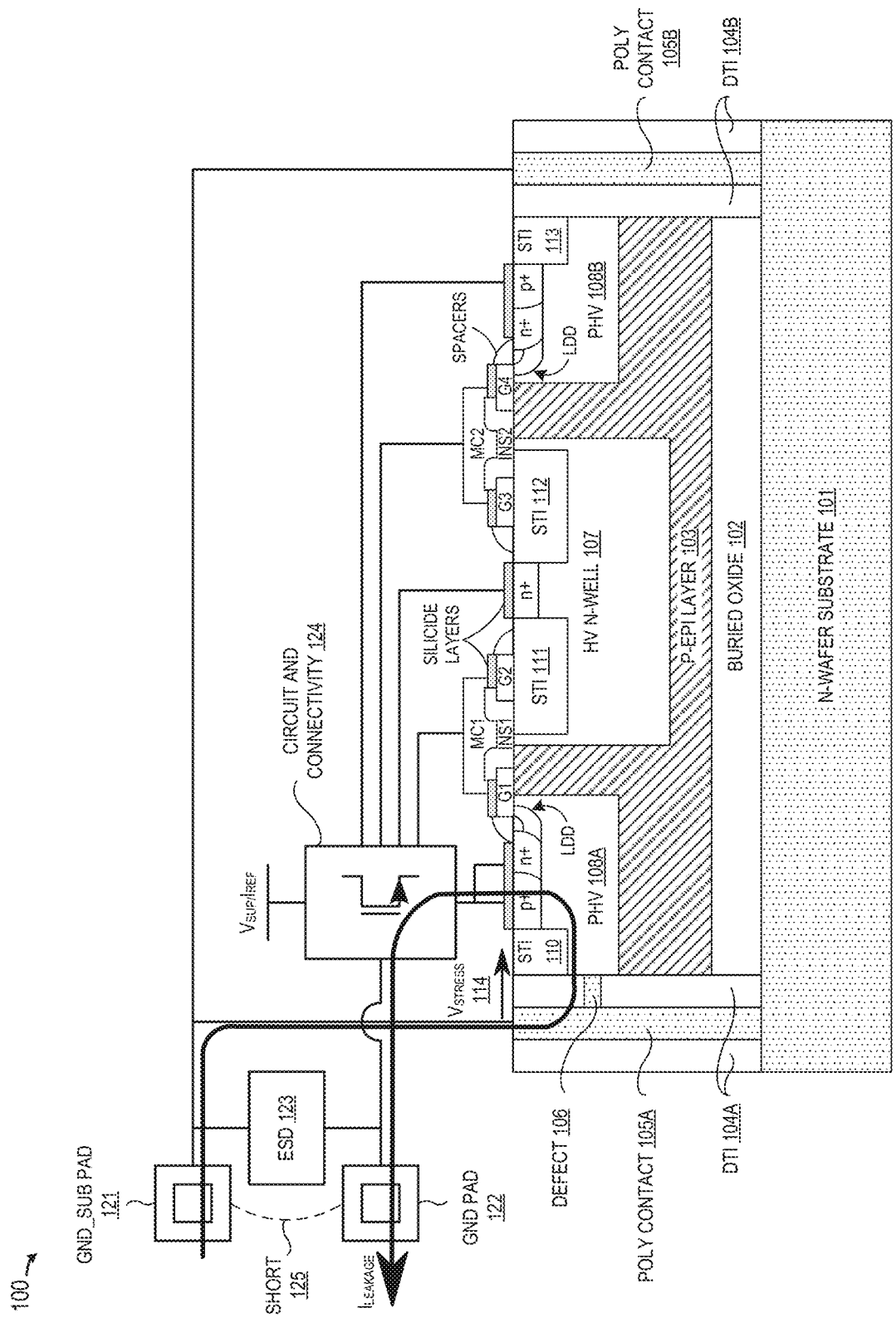
FIG. 1 depicts a first cross-sectional view of an integrated circuit on a semiconductor-on-insulator (SOI) wafer having component devices formed with buried insulator layers that may be screened for defects by applying a stressing voltage in accordance with selected embodiments of the present disclosure.

A method and apparatus are described for fabricating and testing semiconductor devices for defects in buried insulator layers located in DTI structures and/or SOI structures. As disclosed, the semiconductor devices are screened for defects fabricated devices which include one or more dedicated ground bias pads connected across a high voltage ESD clamp to one or more well-driving ground pads so that a stressing voltage may be applied on the buried insulator layer with a die test circuit. In particular, the one or more dedicated ground bias pads are fabricated and constructed to provide a conductive path to the underlying semiconductor wafer substrate, either directly or through conductive layers in one or more DTI structures. In addition, one or more well-driving pads are fabricated or constructed to provide a conductive path to an SOI substrate (e.g., the global well that is formed over the buried oxide), epitaxial layer or well, either directly or across one or more surface circuits on the SOI substrate. With a protective high voltage electrostatic discharge (ESD) clamp connected between the dedicated ground bias pad(s) and well-driving pad(s), a stressing voltage may be applied across buried insulator layers in the DTI structure and/or BOX structure by applying first voltage (e.g. 0 v) to the well-driving ground pad(s) to bias the SOI substrate/well while simultaneously applying a second stressing voltage (e.g., −60 v) to the dedicated bias pad(s) to bias wafer substrate via deep trench conductive structures. With the stressing voltage applied, the defect testing may include or involve measuring leakage current at the well-driving bias pad(s) using a targeted probe without requiring any additional interconnects, insertions, or dedicated probe test card. However, a measurement through the biasing pads can be a workaround, such as by using a dedicated probe test card. In selected embodiments, a negative DTI oxide stressing voltage of at least −40V (and preferably at least approximately −60V) is applied for a predetermined stressing time (e.g., 10 ms) so that any leakage current measured at the well-driving ground bias pad(s) can identify the location of any defect. However, the stressing voltage will depend on the voltage capability of the buried insulator layer. While a targeted goal is to apply a stress at least −60V, selected embodiments may apply a smaller stressing voltage (e.g., −40V) due to limitations on the test equipment. Thus, other technologies could require a different stressing voltage. By measuring the leakage current at the well-driving ground bias pad(s), there is no pollution from parasitic currents in the wafer substrate. In addition, the use of well-driving ground bias pad(s) for current measurement enables the identification of individual wafer die where the detected defect is located. The disclosed embodiments may thus be useful in connection with providing complete test coverage for all buried insulator layers in DTI structures, BOX layers, or other substrate dielectric layers in the semiconductor devices. In selected embodiments, the dedicated substrate bias pad(s) are disabled or shorted with the well-driving ground bias pad(s) (e.g., by being connected over bonding wires to the same package pin or to the package flag) after defect testing and after die singulation during the encapsulation process.

Various illustrative embodiments will now be described in detail with reference to the accompanying figures. As described hereinbelow, the disclosed embodiments can be arranged and designed in a wide variety of different configurations. Thus, the following detailed description of various embodiments, as represented in the figures, is not intended to limit the scope of the present disclosure, but is merely representative of various embodiments. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. In addition, the various aspects of the embodiments are presented in drawings that are not necessarily drawn to scale unless specifically indicated. Furthermore, the described features, advantages, and characteristics of the invention may be combined in any suitable manner in one or more embodiments. One skilled in the relevant art will recognize, in light of the description herein, that the embodiments can be practiced without one or more of the specific features or advantages of a particular embodiment. In other instances, additional features and advantages may be recognized in certain embodiments that may not be present in all embodiments. For example, selected aspects are depicted with reference to simplified cross sectional drawings of a semiconductor device without including every device feature or geometry in order to avoid limiting or obscuring the present invention. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

To provide additional details for an improved contextual understanding of the present disclosure, reference is now made to FIG. 1 which depicts a first cross-sectional view of an integrated circuit 100 on a semiconductor-on-insulator (SOI) wafer 101-113 having component devices formed with buried insulator layers 102, 104A-B that are not readily reachable using traditional screening tests, but that may be tested for defects using the disclosed embodiments for applying a stressing voltage across the buried insulator layers. As depicted, the integrated circuit 100 includes n-type metal-oxide-semiconductor (nMOS) field effect transistor devices formed on a surface of the SOI substrate 103-113 with connecting metallization conductor (MC) and/or silicide layers to connect with the source, drain, and substrate contact regions and conductive gates as shown. For example, each nMOSFET device may be formed with a gate electrode (G1, G2, G3, G4) formed over and separated from the SOI substrate 103-113 by a gate dielectric (not shown), where each gate electrode may include one or more sidewall spacers disposed at and end of the gate electrode, and may be positioned next to at least a first source/drain region (e.g., n+ region) formed in the SOI substrate 103-113 to define a channel region below the gate electrode.

The depicted integrated circuit 100 is shown as being formed on or as part of an SOI wafer substrate 101-113 which may be formed as a bulk semiconductor substrate or other substrate in which one or more additional semiconductor layers and/or well regions are formed using epitaxial semiconductor growth and/or selective doping techniques as described more fully hereinbelow. For example, the SOI wafer substrate 101-113 may be a semiconductor-on-insulator (SOI) type substrate which includes a wafer substrate 101, buried oxide or insulator layer 102, and p-type semiconductor epitaxial substrate layer 103. The wafer substrate 101 may be provided as a handling wafer layer formed of a material having first conductivity type impurities, such as an n-type wafer substrate 101, at a predetermined doping level and depth by using any suitable dopant type and/or concentration. On the handling wafer substrate 101, an insulator layer 102 and thin substrate semiconductor seed layer (e.g., 1.5 um thick p-type substrate layer on top of insulator layer 102) may be formed to provide a seed layer for thick epitaxial growth of the p-type semiconductor substrate layer 103, thereby forming the initial SOI substrate structure 103. Alternatively, the SOI wafer substrate structure 101-103 may be formed by bonding a donor wafer to a handle wafer. With this technique, the n-type wafer substrate 101 and at least part of the dielectric layer 102 are provided as a handle wafer which is bonded or otherwise attached to a donor wafer which includes part of the dielectric layer 102 and the p-type semiconductor layer 103 which may be formed in whole or in part as a p-type epitaxial layer. Alternatively and depending on the type of transistor being fabricated, the semiconductor substrate may be implemented as a bulk silicon substrate, single crystalline silicon (doped or undoped), SOI substrate, or any semiconductor material including, for example, Si, SiC, SiGe, SiGeC, Ge, GaAs, InAs, InP, as well as other III/V or II/VI compound semiconductors or any combination thereof. With selected bulk silicon substrate embodiments, the buried insulation layer 102 may be formed by implanting dielectric material (e.g., silicon oxide) at a predetermined energy and depth in the substrate 101.

In the SOI wafer substrate 101-103, an isolation structure around the active device area includes deep trench isolation (DTI) structures 104A, 104B and/or the buried insulation layer 102, alone or in combination with patterned shallow trench isolation (STI) structures 110-113. As will be appreciated, any desired technique may be used to etch and at least partially fill the trench openings with one or more dielectric (and semiconductor) materials. For example, the deep trench isolation structure 104 may be formed in the SOI wafer substrate 101-103 to surround and isolate the various well regions and active areas in the integrated circuit device 100. In selected embodiments, the deep trench isolation structures 104 are formed using one or more etch masks to etch deep trench openings through the underlying p-epi layer 103 and buried insulation layer 102 (e.g., by applying anisotropic etching to patterned trench etch mask layer) to reach the underlying n-wafer substrate 101. Once the deep trench openings are formed, they are typically lined with one or more insulator layers (e.g., oxide), and then the centers are filled with heavily doped n-type polysilicon 105 to provide a conductive contact path from the surface to the underlying substrate 101. In similar fashion, the STI structures 110-113 may be formed by patterning and etching shallow trench openings in the upper surface of the p-epi layer 103, filling the openings with one or more insulating dielectric layers, and then polishing or planarizing the filling layers down to the surface of the substrate to form the shallow trench isolation (STI) structures 110-113.

Either before or after forming the DTI and STI structures 104, 110-113, additional well, source/drain, and contact regions are formed in the p-epi layer 103 using any suitable pattern, mask, etch, and/or implantation steps. For example, a first mask and selective implantation process may be applied to form the high voltage n-well region 107 in the p-epi layer 103, such as by implanting n-type impurities at a predetermined density and energy to define the HV n-well 107 before forming the STI regions. In similar fashion, a second mask and selective implantation process may be applied to form the p-type high voltage (PHV) region(s) 108A, 108B in the p-epi layer 103, such as by implanting p-type impurities at a predetermined density and energy to define the PHV 108 prior to forming the STI regions. Additional processing steps are performed after forming the STI regions 110-113 to define the gate electrodes (G1-G4) which may be used in combination with one or more additional masks to selectively implant the indicated p+, n+ source/drain, n+ body contact, and lightly doped drain (LDD) regions in the p-epi layer 103.

After forming the doped regions and isolation structures in the SOI wafer 101-113, electrical interconnects are formed over the wafer surface to connect to a first dedicated substrate bias pad 121 (GND_SUB PAD) and a well-driving pad 122 (GND PAD). As will be appreciated, the electrical interconnects may be defined silicide layers and connecting metallization conductors (MC) which are formed with one or more metal materials or layers, including, for instance, an Ohmic metal layer, a transition layer, and a conduction layer. Formed in a stack of dielectric layers (not shown), the metal layers electrically connect the conductive DTI poly contact 105A, 105B (and wafer substrate 101) to the first dedicated ground substrate bias pad 121, and also electrically connect the SOI substrate 103-113 to the well-driving ground pad 122. In addition, a high-voltage ESD clamp circuit 123 is connected between the first dedicated ground substrate bias pad 121 (GND_SUB PAD) and well-driving ground pad 122 (GND PAD) to prevent die damage from occurring during an eventual ESD event between the above-mentioned pads without blocking a significant stressing voltage Vstress applied between the pads 121, 122 that is needed for effective screening. Finally, one or more circuit and connectivity elements 124 are formed between the well-driving ground pad(s) 122 and the semiconductor surface devices formed on the SOI substrate 103-113, thereby enabling the well-driving ground pad(s) 122 to be selectively connected to the SOI substrate 103-113, either directly or across one or more surface circuits on the SOI substrate. As disclosed herein, the circuit and connectivity elements 124 may be included in the packaged integrated circuit device to provide functional and electrical features to the customer, including providing electrical connectivity from the well-driving ground pad 122 for biasing to the well regions in the device.

With the depicted connection of the dedicated ground substrate bias pad 121 and well-driving ground pad 122, a test circuit topology is provided for customized testing to detect defects in buried insulator layers located in the integrated circuit, such as DTI insulator layers 104 and/or SOI insulator layers (e.g., buried oxide layer). To perform the defect testing, a stressing voltage Vstress is applied or forced across the pads 121, 122, thereby stressing each oxide 104A, 104B of the DTI structure oxide so that any leakage current can be measured to detect a potential defect in the DTI structure. In selected embodiments, the stressing voltage is more than simply a voltage that is sufficient to generate a leakage current, but is applied at a sufficiently high voltage over the buried insulator layer to convert latent defects into a failure that registers with the leakage current measurement.

While any suitable stressing voltage can be applied which fits the application use case and the voltage capability of the technology, in selected embodiments, the stressing voltage is applied by applying a first voltage (e.g. 0 v) to the well-driving ground pad 122 to bias the SOI substrate/well 103-108 while simultaneously applying a second voltage (e.g., at least −40V, or preferably at least −60V) to the dedicated ground bias pad 121 to bias wafer substrate via deep trench conductive structures. By supplying the second, strongly negative voltage to the dedicated ground pad 121, the poly contact 105A, 105B and n-wafer substrate 101 are driven to the second, strongly negative voltage. And by supplying the first voltage to the ground pad 122 which is connected by the circuit and connectivity elements 124 to bias the wells (devices) on the SOI substrate 103-109, wells 103, 107-108 are driven to the first, relatively small voltage (e.g., 0V). Thus, the circuit and connectivity elements 124 may comprise one or more FET switches which are controlled to the properly select the driving pads 122 for biasing the SOI substrate 103 to the second voltage (e.g., approximately 0V).

In selected embodiments, while the ground pad(s) 122 are used as selective driving pads to hold all wells at the first voltage of 0V, the dedicated ground pad(s) 121 can be used to drive the wafer substrate 101 to a stressing voltage in the range of −40V to −60V or possibly +40V to +60V if the circuit or underlying technology conditions allow. In other embodiments, the n-wafer substrate 101 may be driven by the dedicated ground pad(s) 121 to a stressing voltage of between −45V and −65V with the ESD clamp 123 being connected to protect the integrated circuit 100 against an eventual ESD event during wafer testing and/or wafer shipping. However, it will be appreciated that both positive and negative biasing may be applied between the biasing and the driving pads. For example, some technologies could manage a bidirectional stress with the same magnitude of the voltage.

In referring to a "dedicated" ground pad 121, it is understood that the substrate 101 and poly contact 105A, 105B are biased with a pad that is not shared with the rest of the circuitry of integrated circuit 100, with the single exception of the ESD clamp protection circuit 123. As a result, while the net is often shorted to ground at the package level after die fabrication for electromagnetic compatibility and/or ESD protection reasons, the net should be separated from the dedicated ground pad(s) 121 in accordance with the present disclosure. This prevents connected circuitry or devices from injecting leakage current through the dedicated ground pad(s) 121 which can distort the leakage current measurements being used to detect defects. In addition, it prevents potentially biasing the "on die" devices with the stressing voltage, which can damage them.

By applying the stressing voltage Vstress across the pads 121, 122, any defects in the DTI insulator 104A can be detected by measuring the leakage current $I_{LEAKAGE}$ while the dedicated ground pad(s) GND_SUB PAD 121 is forced to the stressing voltage (−40 to −60V). For example, if a defect 106 is present in the DTI insulator layer 104A, this can be detected by measuring the leakage current with a measurement probe applied to the ground pad(s) 122 or the dedicated ground pad(s) 121. Though not shown, another defect location that can be detected by measuring the leakage current would be a defect in the buried oxide layer 102 which shorts or connects the n-wafer substrate 101 and p-epi layer 103. Due to parasitic current noises that can appear at the dedicated ground pad(s) 121 (GND_SUB PAD), the testing measurement for DTI defects may be made by applying or contacting the ground pad 122 (GND PAD) with a measurement probe.

By providing the dedicated ground pad(s) 121 and ground pad(s) 122 with direct connections for biasing the n-wafer substrate 101 and substrate wells 108, stressing voltages may be applied to the pads 121, 122 to support unlimited defect testing of buried insulator layers by measuring the leakage current $I_{LEAKAGE}$ which flows from the ground pad(s) 122 to the dedicated ground pad(s) 121 under the protection of the high-voltage ESD clamp circuit 123 which directly connects the pads 121, 122. The defect testing thus need not be limited to detecting surface defects, as in past visual screening tests. The test circuits and methods of the disclosed embodiments provide a technique for applying stressing voltage to all buried insulators in an integrated circuit (IC) product. The disclosed embodiments may thus support a leakage current test and measurement methodology more comprehensive than the tests and measurements otherwise available. Zero defect screening for buried oxide layer defects may thus be achieved. The disclosed embodiments may alternatively or additionally be used to reduce the amount of circuitry and wafer area devoted to built-in self-testing (BIST).

The testing may be implemented by using the dedicated ground pad(s) 121 and ground pad(s) 122 as a set of probe pads to simultaneously test all devices on a wafer for buried insulator defects. The simultaneous testing may be implemented in parallel. The test circuits may include a row and column or other interconnect scheme that crosses die boundaries or otherwise minimizes prober index time. Although useful for testing at the wafer level, the disclosed embodiments are scalable for testing at various levels of specificity. The test circuit may be configured for testing on a die-by-die basis or at a reticle or wafer quadrant level. After testing, the network of the dedicated ground pad 121 is often shorted to the grounded network of ground pad(s) 122 at die level for EMC and ESD reasons, as indicated with the dashed line 125. As will be appreciated, any suitable shorting structure may be used to short the pads 121, 122, such as by forming a conductive path that electrically shorts the dedicated ground pad(s) 121 and ground pad(s) 122.

Figure 2:
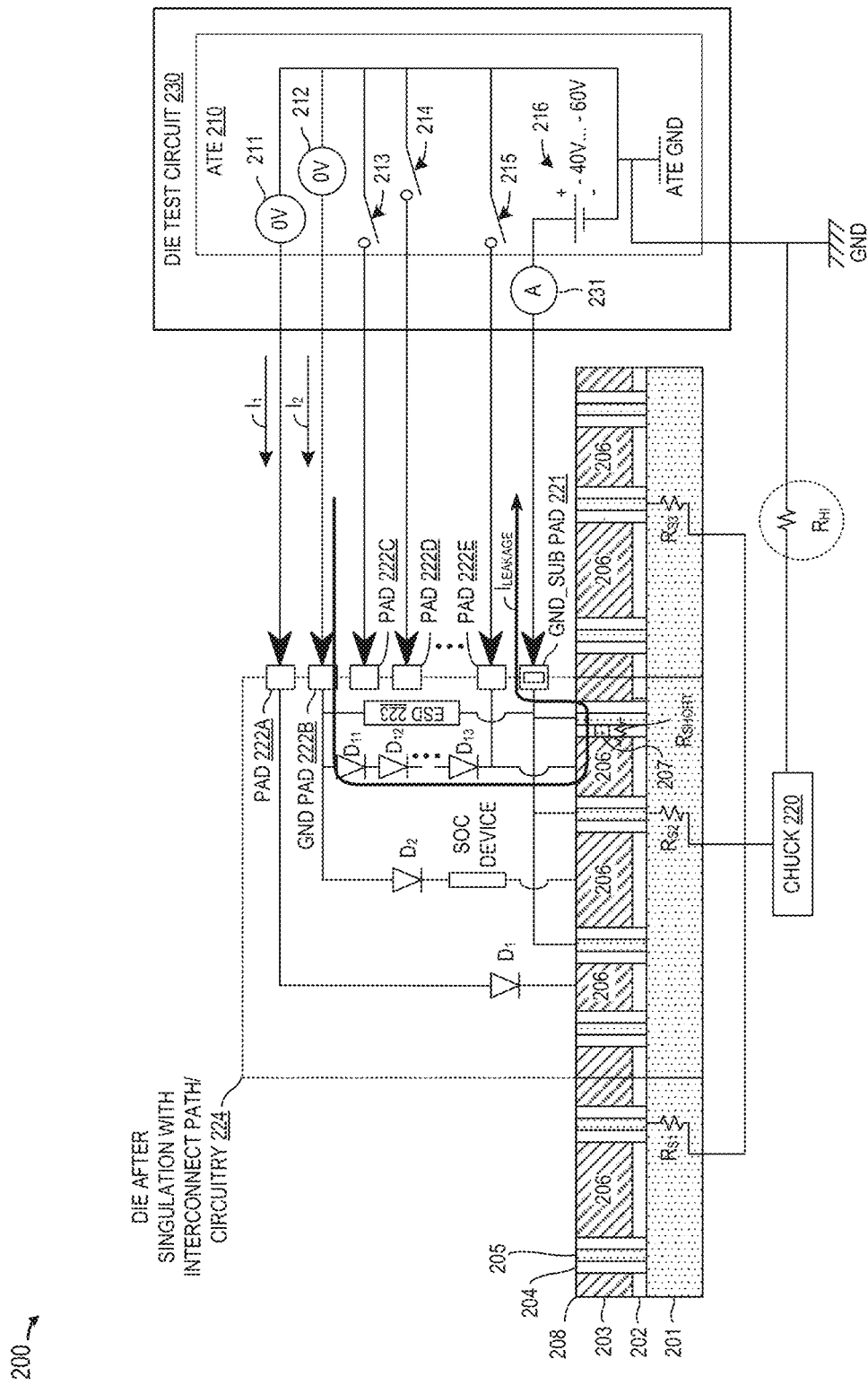
FIG. 2 depicts a wafer level testing system for multiple integrated circuit dies with a die test circuit connected to screen for defects in a buried insulator layer formed in an underlying substrate.

For an improved understanding of selected embodiments of the present disclosure, reference is now made to FIG. 2 which depicts a wafer level testing system 200 for multiple integrated circuit dies with a die test circuit 230 connected to test an integrated circuit 224 to screen for defects 207 in a buried insulator layer 204 formed in the integrated circuit substrate 201-206. In this example, the integrated circuit 208 includes semiconductor devices, such as MOSFETs (not shown) formed on a surface of the SOI substrate 201-205 which includes a first wafer substrate layer 201, buried insulator layer 202, and epitaxial layer 203 formed sequentially to define the SOI substrate 201-203. In addition, the integrated circuit 208 includes isolation structures 202, 204-205 to separate and electrically isolate active device well areas 206 from one another. In particular, an isolation structure around each active device area 206 may include deep trench isolation (DTI) structures 204-205 formed in deep trench openings through the layers 202-203 that expose the first wafer substrate layer 201 and that are lined with one or more insulator layers 204 (e.g., oxide) and then filled with a conductive material 205 (e.g., doped polysilicon) to provide a conductive contact path from the surface to the underlying substrate 201. In addition or in the alternative, an isolation structure may include a buried insulation layer 202 formed between the first wafer substrate layer 201 and epitaxial layer 203 using any suitable technique (e.g., deposition, oxidation, or implantation).

To screen for defects in buried insulators, such as the DTI lining defect 207, that are not readily reachable using traditional screening tests, the die test circuit 230 may be implemented as a probe card that is connected to the integrated circuit 208 through a dedicated substrate ground pad 221, one or more device pads 222A, 222B, and interconnect path/circuitry on the die 224 to apply a stressing voltage across the buried insulator layers, such as the buried insulator layer 202 and/or DTI oxide liner layer 204. In particular, the stressing voltage is developed between the conductive material layer 205 and the active device well areas 206 with sufficient force that a conduction path over the shorting resistance $R_{SHORT}$ caused by the defect 207 creates a leakage current $I_{LEAKAGE}$ that can be measured by the die test circuit 230. For example, by biasing all of the active device well areas 206 with a first biasing voltage applied to the one or more device pads 222A, 222B, and simultaneously biasing the substrate wafer 201 and DTI structures 205 to $-V_{STRESS}$ with a second biasing voltage applied to the dedicated substrate ground pad 221, any leakage current is measured as the sum of the currents $I_1$, $I_2$ measured through the device pads 222A, 222B which can be used to detect which die (e.g., 224) has a buried insulator defect 207 by using a pass/fail current threshold criteria. As will be appreciated, other bias voltages can be applied. For example, the first biasing voltage may be 0V, or may be +/−5V, depending on the application. In addition, the second biasing voltage may be −60V, though larger or smaller negative stressing voltages may be applied. As a result of applying the stress voltage across the pads 221, 222, the screening test can detect not only defects 207 in the DTI liner layer 205, but can also detect defects in the buried insulator layer 202.

To this end, the die 224 may include a first interconnect path formed over the integrated circuit wafer surface to connect to the dedicated substrate ground pad 221 (GND_SUB PAD) to one or more of the conductive DTI poly contacts 205 and to the first wafer substrate layer 201. In addition, the die 224 may include a second interconnect path formed over the integrated circuit wafer surface to connect to the one or more device pads 222A-E (e.g., GND PAD 222B) to one or more of the active device well areas 206. Using any suitable fabrication process, the interconnect paths may include defined silicide layers and connecting metallization conductors (MC) which are by formed with one or more metal materials or layers (e.g., an Ohmic metal layer, a transition layer, and a conduction layer) formed in a stack of dielectric layers (not shown). In the depicted example, ground pad 222B is used to bias the active device areas 206. In addition, pad 222A may be used to measure the current $I_1$ and to drive an additional well 206 if required to bias wells that the ground pad 222B cannot efficiently drive or connect to, thereby increasing screening coverage. In the depicted example, circuit pads 222C-E are not used in for well driving or measurements since pads 222A-B are enough to achieve good biasing coverage of the wells. Thus, the pads 222C-E can have any function in the system (e.g., input, output, supply) and are left unconnected to avoid distorting the leakage current measurement which is made through all connected pads 222A-B by summing the currents $I_1$, $I_2$ measured at the pads 222A, 222B. However, any of the pads 222C-E could be used as additional well grounding pads, such as by applying a biasing voltage to the probe card needles that are used during the unit probe test.

To protect devices on the integrated circuit 208 when a stressing voltage is applied, the interconnect path/circuitry 224 also includes a high-voltage ESD clamp circuit 223 connected between the dedicated substrate ground pad 221 and device ground pad(s) 222B. Additional ESD protection is provided by connecting a chuck 220 to bias the first wafer substrate layer 201 to application of the stressing voltage. Preferably, the chuck 220 is left unconnected during normal operation, but can be connected over an optional high value resistance $R_{HI}$ (e.g., >1MΩ) to earth ground. However, this connection of the chuck 220 creates a parasitic current which can interfere with accurate measurement of the leakage current if taken at the dedicated substrate ground pad 221, so the leakage current should instead be measured at the device ground pads 222 which also allows the identification of which die is leaking due to the buried insulator defect.

As disclosed herein, the die test circuit 230 may be embodied with any suitable probe testing equipment for generating the stressing voltage that is applied across the buried insulator layers and for measuring any resulting current which indicates the presence of a defect 206 in a buried insulator, such as the DTI liner layer 204 or buried insulator layer. For example, the die test circuit may be implemented with an automatic test equipment (ATE) 210 which generates test signals that are supplied to the device under test (DUT), namely the integrated circuit 208, and also receives or measures response signals from the DUT. To this end, the depicted ATE 210 includes one or more first voltage generators 211, 212 for generating a first bias voltage signal (e.g., 0V) that is supplied to a corresponding device pads 222A, 222B (GND PAD). In addition, the ATE 210 includes a second voltage generator 216 for generating a second, strongly negative bias voltage signal (e.g., −40V to −60V) that is supplied to the dedicated substrate ground pad 221 (GND_SUB PAD). Alternatively, a strongly positive voltage could be applied. In selected embodiments, the negative bias voltage signal should be −40V in cases where automotive products can see this stress and the test equipment is only able to generate this voltage, though the targeted negative bias voltage can be any different stressing voltage (e.g., −60V or −65V) for improved defect screening performance. As will be appreciated, there can be situations where the ATE 210 is not able to generate the second, strongly negative bias voltage signal, in which case the die test circuit 230 may include an additional or separate bias voltage generator 231 which is connected to provide the required bias voltage signal to the dedicated substrate ground pad 221. In cases where the ATE 210 is connected to other pads 222C-222E on the die 224, one or more switching circuits 213-215 in the ATE 210 may be provided to disconnect the pads 222C-E during probe testing for buried insulator defects.

To prevent parasitic currents from distorting the leakage current measurements, all of the DTI structures 204-205 are connected to the dedicated substrate bias pad 221 (GND_SUB PAD) which in turn is not connected to any other circuitry except for the ESD clamp circuit 223. In selected embodiments, the ESD clamp circuit 223 provides sufficient ESD protection (e.g., 65V) to avoid leakage during testing with the stressing voltage (e.g., |Vclamp|>|Vstress|) and to also avoid the voltage from exceeding the damaging level of the connected devices (e.g., |Vclamp|<|Vbreakdown|). However, it will be appreciated that, for extended stress, the ESD clamp 223 may provide stronger protection (e.g., 90V). Conversely, a regular low voltage ESD clamp does not allow a sufficient screening voltage. In selected embodiments, it is possible to include multiple, separate dedicated ground bias pads for biasing the substrate 201 at unit probe, but they should be reconnected at the package level. For example, four dedicated ground bias pads can be shorted together at the die level to provide a solid ground substrate connection with a single probe needle, with one per side of the die.

Figure 3:
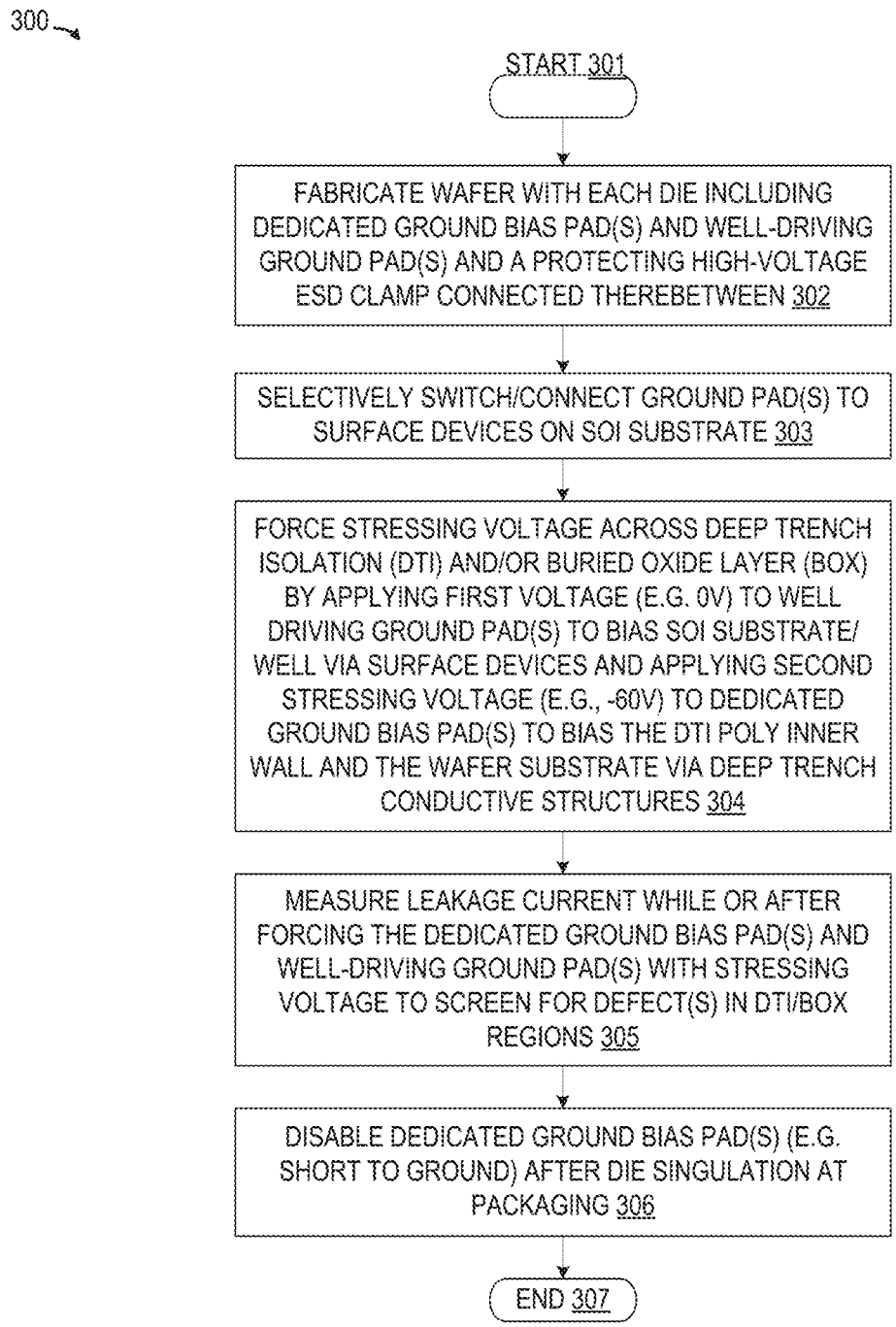
FIG. 3 depicts a simplified flow chart showing the process flow for detecting defects in a deep trench isolation layer by applying a stressing voltage on the deep trench isolation layer using dedicated ground bias pads and well-driving ground pads connected by a high voltage ESD clamp in accordance with selected embodiments of the present disclosure.

To provide additional details for an improved understanding of selected embodiments of the present disclosure, reference is now made to FIG. 3 which depicts a simplified flow chart showing the process flow for fabricating and testing a semiconductor device to detect defects in a buried isolation layer formed in the semiconductor device. After the process starts at step 301, a sequence of sequence of fabrication steps are performed at step 302 to fabricate a wafer containing multiple dice, where each die includes one or more dedicated ground bias pads connected across a high-voltage ESD clamp circuitry to one more well-driving ground pads.

With respect to the fabrication step 302, there may be a number of preliminary steps be directed to preparing a wafer substrate for subsequent processing. Any bulk or composite substrate may be used, though in selected embodiments, an SOI wafer substrate is fabricated which includes an underlying wafer substrate, buried insulator layer, and epitaxial semiconductor layer. In the SOI wafer substrate, active device regions are defined and delineated in the epitaxial semiconductor layer with deep trench isolation structures which extend from the surface of the SOI wafer substrate down to the underlying wafer substrate. As formed, each deep trench isolation structure is formed in a deep trench opening to include one or more outer insulator liner layers and a conductive (e.g., doped poly) inner layer which makes direct electrical contact with the underlying wafer substrate. On the active device regions, additional steps are performed at step 302 to fabricate semiconductor devices, such as additional well regions, gate electrodes, and associated source/drain regions, on the surface of the SOI wafer substrate. For example, well regions may be formed by doping the epitaxial semiconductor substrate layer with any suitable dopant implantation procedure to define a n-type or p-type well regions. In addition, gate electrodes may be selectively formed by depositing, patterning, and etching a conductive polysilicon layer formed over one or more gate dielectric layers, and then used with one or more selective masks to implant the source and/or drain regions. As will be appreciated, other device regions, such as shallow trench insulators or resistors, may also be formed at this time. The processing at step 302 also forms interconnect paths with defined silicide layers and connecting metallization conductors (MC) which are by formed in a stack of dielectric layers to make direct electrical connection with contact pads formed in an uppermost metal layer. These pads include one more well-driving ground pads which are connected across an ESD clamp circuit to the one or more dedicated ground bias pads which, at the fabrication stage, are not connected to any other circuitry on the die with the single exception of the ESD clamp protection circuit. As a result of step 302, there is formed an integrated circuit device with a plurality of I/O and reference voltage pads, including the dedicated ground bias pad(s) and well-driving ground pad(s).

At step 303, switching circuitry in the integrated circuit device may be used to selectively switch or connect the well-driving ground pads to the surface semiconductor devices on the SOI wafer substrate, and thereby to the underlying well region(s). With this step, other I/O and reference voltage pads are disconnected from accessing the surface semiconductor devices, such as by opening any connecting switches to the other I/O and reference voltage pads. In addition, connecting switches may be closed to connect each well-driving ground pad to a corresponding well region. By properly selecting and closing the connecting switches, a group of well-driving ground pads can be connected to most or all of the underlying wells. The selection connection process at step 303 can take into account any circuit elements in the path between the well and well-driving ground pad (e.g., a forward-biased diode, Zener diode, or resistor) in terms of impact on the well bias result. In addition or in the alternative to using switching circuitry in the integrated circuit device, the selective switching/connection at step 303 may use control switches in the ATE or die test circuit by disconnecting any pads from receiving an biasing voltage except for the well-driving ground pad(s) and the dedicated ground bias pad(s). For example, in cases where the die is not provided with supply voltages during the test, any potential application of bias voltages must be driven from outside of the die, such as by using the control switches in the ATE.

At step 304, a test circuit is connected with the integrated circuit device to force a stressing voltage across a buried insulator, such as a deep trench isolation (DTI) structure and/or buried oxide layer. To apply the stressing voltage, a first voltage (e.g., 0V) is applied to the well-driving ground pad(s) in order to bias the underlying well regions in the SOI wafer substrate/well via the semiconductor surface devices. Simultaneously, a second stressing voltage (e.g., −60V) is applied to the dedicated ground bias pad(s) in order to bias the underlying wafer substrate via the conductive poly inner wall/layer in the DTI structures. With the high-voltage ESD clamp connected between the well-driving ground pad and dedicated ground bias pad, the surface semiconductors are protected against electrostatic discharge events. In selected embodiments, the test circuit may be embodied as an automatic test equipment probe card which is capable of applying a negative stress voltage of at least −60V to −65V so that the underlying well regions are biased at 0V and the conductive layer in the DTI structures is biased to at least −60V. And as described above, the test circuit may include reference voltage generators which are applied through one or more switching circuits to bias the wells and DTI structures through the dedicated ground bias pad and well-driving pad(s), respectively. During step 304, one or more first probe pads and corresponding interconnect networks from the test circuit may be used to apply a first voltage (e.g., 0V or +/−5V) to bias the well-driving pad(s). In addition, a second probe pad and corresponding interconnect networks of the test circuit may be used to apply a second strongly negative voltage (e.g., −65V) to bias the wafer substrate region(s).

At step 305, the leakage current is measured after or while the dedicated ground bias pad and well-driving pad(s) are simultaneously forced with the stressing voltage to screen for one or more buried insulator defects in the deep trench isolation structure and/or buried oxide region. In selected embodiments, the leakage current may be measured as the sum of the currents flowing through the well-driving pad(s). As described above, the test circuit may include one or more current measurement circuits for measuring current flow through each of the well-driving pad(s). As disclosed herein, the current measurement at step 305 may include a number of operations. For example, a baseline or reference leakage current value may be retrieved or established to define a baseline or reference level for an integrated circuit in which there are no buried insulator defects. During step 305, the one or more first probe pads and corresponding interconnect networks from the test circuit may be used to measure the leakage current generated by the stressing voltage. The leakage current measurement data may be compared with a baseline or reference leakage current value to determine if a buried insulator defect exists in the integrated circuit device. By tracking leakage current values at each well-driving pad, the individual die region can be identified where the defect is located.

At step 306, the dedicated ground bias pad(s) are functionally removed from the integrated circuit device. As will be appreciated, this occurs only after the ground biasing pad is used to bias the substrate during the functional and parametric probe tests. In selected embodiments, this may be achieved by shorting the dedicated ground bias pad(s) to ground (e.g., the well-driving pad(s)) at the package level. As will be appreciated, this prevents the ability to screen for buried insulator defects in the final packaged chip since the wells and wafer substrate region cannot be separately biased.

At step 307, the testing processing ends. At this point, the fabrication of the semiconductor device may continue with singulation into individual integrated circuit die and additional packaging steps. Of course, the order of the acts described above may vary to form specific device regions and features needed for any particular integrated circuit application. It will be appreciated that additional processing steps will be used to fabricate the semiconductor device described herein, such as a nitride strip process, preparation and formation of one or more sacrificial oxide layers, shallow trench isolation regions, and formation of various buried well or regions. In addition, other circuit features may be formed on the wafer structure, such as capacitors, diodes, etc. As examples, one or more sacrificial oxide formation, stripping, isolation region formation, well region formation, gate dielectric and electrode formation, extension implant, halo implant, spacer formation, source/drain implant, heat drive or anneal steps, and polishing steps may be performed, along with conventional backend processing (not depicted), typically including formation of multiple levels of interconnect that are used to connect the transistors in a desired manner to achieve the desired functionality. Thus, the specific sequence of steps used to complete the fabrication of the semiconductor structures may vary, depending on the process and/or design requirements.

Figure 4:
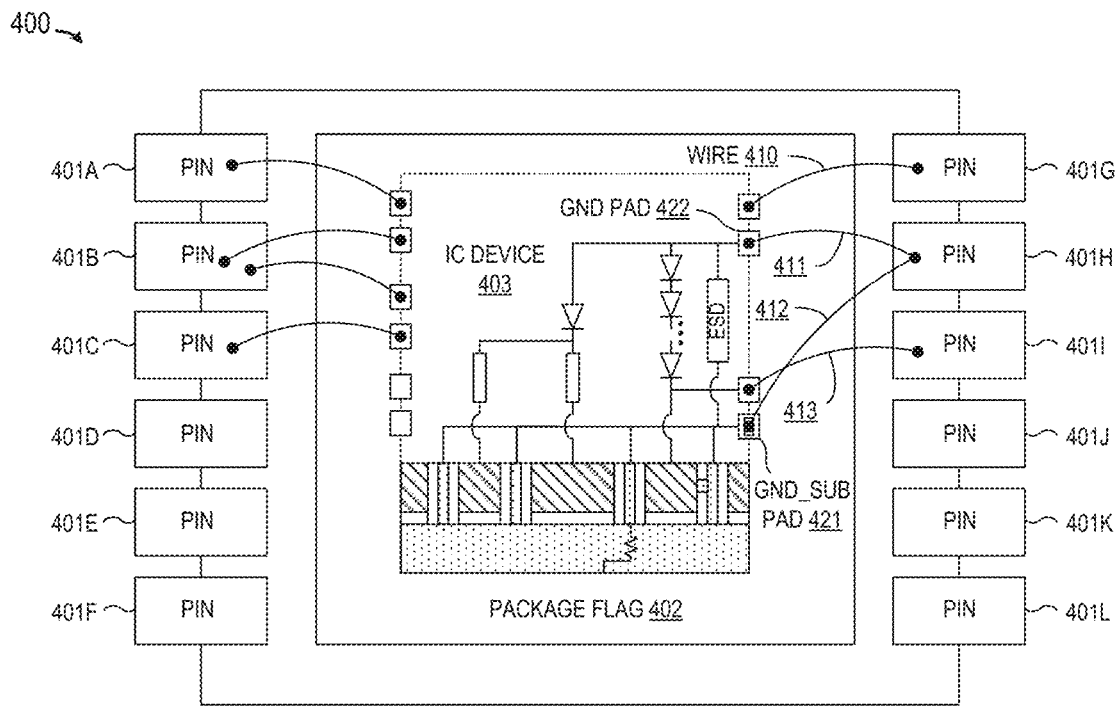
FIG. 4 depicts a simplified plan view of wiring connections for a first packaged integrated circuit device in which dedicated ground bias pads and well-driving ground pads are connected to the same package pin in accordance with selected embodiments of the present disclosure.

For an improved understanding of selected embodiments of the present disclosure, reference is now made to FIG. 4 which depicts a simplified plan view 400 of a first packaged integrated circuit device 403 wherein the dedicated ground substrate bias pad(s) are disabled or shorted with the well-driving bias pad(s) after defect testing during the packaging process. The disclosed integrated circuit device 403 includes the test circuit having the dedicated ground substrate bias pad 421 and well-driving bias pad 422 connected over the ESD clamp 423 and further connected to the bias the substrate and well regions, respectively, of three integrated circuit device 403 during screen testing. As illustrated, the integrated circuit device 403 is mounted on a package flag 402 which is electrically isolated from the package pins 401A-L. and bonding wires (e.g., 410-413) are attached to connect the pads (e.g., 421, 422) to the package pins 401A-L. In the illustrated embodiment, the dedicated ground bias pad 421 and well-driving bias pad 411 are shorted together by bonding wires 411, 412 which connect the pads 421, 422 to the same package pin 401H. As described hereinabove, the function of the ESD clamp 423 is to protect the buried insulators oxides against electrical stresses that can occur during the assembly process, when putting a needle during probe test or when handling the wafer. However, once the pads 421, 422 are shorted at package level to the same package pin 401H, the ESD clamp 423 has no effect.

Figure 5:
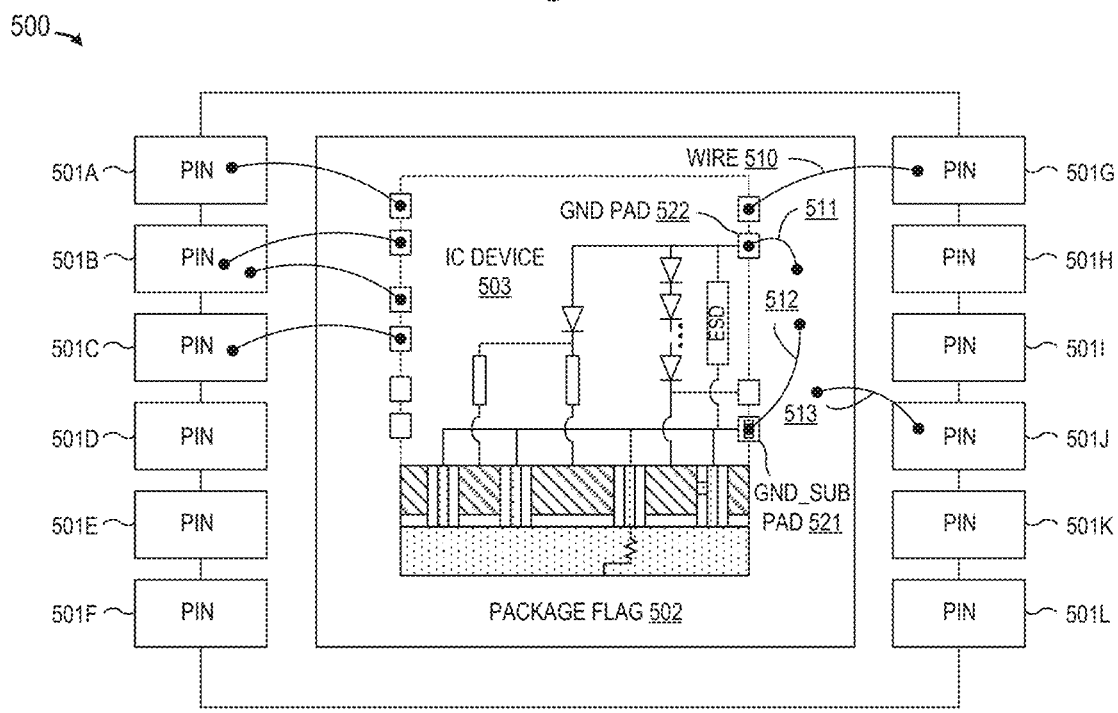
FIG. 5 depicts a simplified plan view of wiring connections for a second packaged integrated circuit device in which dedicated ground bias pads and well-driving ground pads are connected to a package flag in accordance with selected embodiments of the present disclosure.

For an improved understanding of selected embodiments of the present disclosure, reference is now made to FIG. 5 which depicts a simplified plan view 500 of a second packaged integrated circuit device 503 wherein the dedicated ground substrate bias pad(s) are disabled or shorted with the well-driving bias pad(s) after defect testing during the packaging process. The disclosed integrated circuit device 503 includes the test circuit having the dedicated ground substrate bias pad 521 and well-driving bias pad 522 connected over the ESD clamp 523 and further connected to the bias the substrate and well regions, respectively, in the integrated circuit device 503 during screen testing. As illustrated, the integrated circuit device 503 is mounted on a package flag 502 which is electrically isolated from the package pins 501A-L, and bonding wires (e.g., 510-513) are attached to connect the pads to the package pins 401A-L. In the illustrated embodiment, the dedicated ground bias pad 521 and well-driving bias pad 511 are shorted together by the bonding wires 511, 512 which connect the pads 521, 522 to the package flag 502 which, in turn, is connected over a bonding wire 513 to the package pin 501J. Again, the protective function of the ESD clamp 523 is eliminated once the pads 521, 522 are shorted over the package flag to the same package pin 501J.

The embodiments described above are capable of wafer-level, zero defect screening. The test circuits may also be configured to provide any desired level of testing. The test circuits may be designed to test buried insulators in a limited number of active device regions or other components, such as the components of one or more circuits, or one or more die, e.g., a group of die corresponding to a single reticle, or any other wafer subset. These and other testing levels may be pursued in the interest of satisfying fabrication cost or time constraints.

By now, it should be appreciated that there has been provided a method and apparatus for testing an integrated circuit device for buried insulator defects. As disclosed, a test circuit is formed in an integrated circuit device which includes a dedicated ground bias pad connected across a high voltage electrostatic discharge clamp circuit to a well-driving ground pad, where the dedicated ground bias pad is electrically connected only to bias a wafer substrate in the integrated circuit device through a conductive structure in a deep trench isolation structure and is not connected to any other circuitry on the integrated circuit device, and where the well-driving ground pad is electrically connected to bias a well region in the integrated circuit device. In selected embodiments, the test circuit is formed with a single well-driving ground pad that is electrically connected to the well region through one or more semiconductor devices formed on a surface of the well region. In the disclosed testing method and apparatus, a first voltage is applied to the dedicated ground bias pad to bias the wafer substrate while a second voltage is simultaneously applied to the well-driving ground pad to bias the well region, where the first and second voltages create a strongly negative stressing voltage across a buried insulator layer in the integrated circuit device. In selected embodiments, the first voltage is applied as a negative voltage to the dedicated ground bias pad to bias the wafer substrate. Stated generally, the resulting stressing voltage is greater than an absolute maximum rating of an application specification for the integrated circuit device (e.g., the absolute max rating) and is lower than the breakdown voltage of the buried insulator layer (e.g., the DTI and buried oxide layer). Thus, the |Absolute max rating of the IC|<|Vstress|<|BV of the DTI/Box|. In other embodiments, the second voltage is applied as a voltage of approximately 0V to the well-driving ground pad to bias the well region. In other embodiments, the second voltage is applied as a voltage of approximately +/−5V to the well-driving ground pad to bias the well region. In addition, the disclosed testing method and apparatus conducts a screen for a defect in the buried insulator layer by measuring a leakage current at the well-driving ground pad or the dedicated ground bias pad. In selected embodiments, screening test is conducted by measuring the leakage current at the well-driving ground pad to screen for a defect in a buried insulator layer formed between the wafer substrate and the well region. In other embodiments, the screening test is conducted by measuring the leakage current at the well-driving ground pad to screen for a defect in an insulator liner layer formed between the conductive structure in the deep trench isolation structure and the well region. In selected embodiments, the dedicated ground bias pad is shorted to the well-driving ground pad after conducting the screening test and during packaging of the integrated circuit device.

In another form, there is provided a device and associated method of manufacture. As disclosed, the device includes a semiconductor on insulator (SOI) substrate having device regions disposed at a surface of the SOT substrate and isolated from one another by deep trench isolation structures which extend from the surface of the SOI substrate to an underlying semiconductor substrate separated from the SOI substrate by a first buried insulator layer substrate. The disclosed device also includes a first set of semiconductor devices formed on the surface of the SOI substrate in each device region. In addition, the disclosed device includes a test circuit portal supported by the SOI substrate which includes a dedicated semiconductor substrate bias terminal connected across a high voltage electrostatic discharge clamp circuit to one or more ground terminals. In selected embodiments, the high voltage electrostatic discharge clamp circuit is a combination of transistors and diodes that provides a protection against electrostatic discharges for the first set of semiconductor devices formed on the surface of the SOI substrate. In selected embodiments, the high voltage electrostatic discharge clamp circuit may be a 65V+ electrostatic discharge clamp. In other embodiments, the high voltage electrostatic discharge clamp circuit protects buried insulator layers in the device against electrical stresses by discharging electrostatic discharges between the dedicated semiconductor substrate bias terminal and the one or more ground terminals. As disclosed, the dedicated semiconductor substrate bias terminal is electrically connected to the semiconductor substrate through one or more conductive structures in the deep trench isolation structures while being otherwise electrically isolated from the first set of semiconductor devices. In addition, the one or more ground terminals are electrically connected to the device regions in the SOI substrate, either directly or through the first set of semiconductor devices. In selected embodiments, the test circuit portal includes a first conductive interconnect path that electrically connects the semiconductor substrate to the dedicated semiconductor substrate bias terminal, and also includes a second conductive interconnect path that electrically connects the device regions to the one or more ground terminals. In selected embodiments, a first voltage supplied to the dedicated semiconductor substrate bias terminal by a first external probe biases the semiconductor substrate and a second voltage supplied to the one or more ground terminals by a second external probe biases the SOI substrate to create a strong stressing voltage across the first buried insulator layer in the device that is greater than an absolute maximum rating of an application specification for the device and that generates a leakage current that can be measured at the one or more ground terminals to detect a defect in the first buried insulator layer. In selected embodiments, the first buried insulator layer is formed between the semiconductor substrate and the SOI substrate where the device regions are disposed. In other embodiments, the first buried insulator layer is an insulator liner layer formed between a first conductive structure in a first deep trench isolation structure and the SOI substrate. As finally formed, the device may include a conductive path which forms an electrical short between the dedicated semiconductor substrate bias terminal and the one or more ground terminals.

In yet another form, there is provided a method of fabricating and testing a semiconductor device. In the disclosed methodology, a semiconductor on insulator (SOI) layer is formed over a wafer substrate. In addition, one or more device regions are formed in the SOI layer, and a deep trench isolation structure is formed around the device regions which extends from a surface of the SOI layer to the wafer substrate. In addition, the disclosed methodology forms a test circuit over the semiconductor substrate. As formed, the test circuit includes first and second sets of interconnects electrically connected, respectively, to the device regions and the wafer substrate. In selected embodiments, the first set of interconnects is formed to include a dedicated ground bias pad that is electrically connected to the wafer substrate through a conductive structure in the deep trench isolation structure. In addition, the second set of interconnects may be formed to include one or more ground bias pads that are electrically connected to SOI layer through the device regions. In addition, the test circuit includes a high voltage electrostatic discharge clamp circuit connecting the first and second sets of interconnects to protect the device regions against electrostatic discharges. The disclosed methodology also conducts a test with the test circuit to detect defects in a buried insulator layer in the semiconductor device. In selected embodiments, the test may be conducted by applying a first voltage to the dedicated ground bias pad to bias the wafer substrate while simultaneously applying a second voltage to the one or more ground bias pads to bias the SOI layer, where the first and second voltages create a strongly negative stressing voltage across the buried insulator layer. With the first and second voltages applied, a screening test may be conducted to screen for a defect in the buried insulator layer by measuring a leakage current at the one or more ground bias pads. In selected embodiments, the first voltage is applied as a negative voltage of at least −60V to the dedicated ground bias pad to bias the wafer substrate. In addition, the second voltage may be applied as a voltage of approximately 0V to the one or more ground bias pads to bias the SOI layer. The disclosed methodology may also short the first and second sets of interconnects after conducting the test. In addition, the disclosed methodology may singulate the wafer substrate into individual semiconductor devices which are encapsulated and packaged.

Although the described exemplary embodiments disclosed herein are directed to various semiconductor devices and methods for making and testing same for buried insulator defects, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising." or any other variation thereof, are intended to cover a non-exclusive inclusion, such that a process, method, article, or apparatus that comprises a list of elements does not include only those elements but may include other elements not expressly listed or inherent to such process, method, article, or apparatus.

The disclosure extends to the following series of lettered clauses:

A. A method of fabricating and testing a semiconductor device, comprising: forming a semiconductor on insulator (SOI) layer over a wafer substrate; forming device regions in the SOI layer; forming a deep trench isolation structure around the device regions which extends from a surface of the SOI laver to the wafer substrate; forming a test circuit over the semiconductor substrate, the test circuit comprising: first and second sets of interconnects electrically connected, respectively, to the device regions and the wafer substrate, and a high voltage electrostatic discharge clamp circuit connecting the first and second sets of interconnects to protect the device regions against electrostatic discharges; and conducting a test with the test circuit to detect defects in a buried insulator layer in the semiconductor device.

B. The method of clause A, further comprising shorting the first and second sets of interconnects after conducting the test.

C. The method of clause A, where forming the test circuit comprises forming the first set of interconnects to include a dedicated ground bias pad that is electrically connected to the wafer substrate through a conductive structure in the deep trench isolation structure.

D. The method of clause C, where forming the test circuit comprises forming the second set of interconnects to include one or more ground bias pads that are electrically connected to SOI layer through the device regions.

E. The method of clause D, where conducting the test comprises: applying a first voltage to the dedicated ground bias pad to bias the wafer substrate while simultaneously applying a second voltage to the one or more ground bias pads to bias the SOI layer, where the first and second voltages create a strongly negative stressing voltage across the buried insulator layer; and conducting a screening test to screen for a defect in the buried insulator layer by measuring a leakage current at the one or more ground bias pads.

F. The method of clause E, where applying the first voltage comprises applying a negative voltage of at least –60V to the dedicated ground bias pad to bias the wafer substrate.

G. The method of clause F, where applying the second voltage comprises applying a voltage of approximately 0V to the one or more ground bias pads to bias the SOI layer.

H. The method of clause A, further comprising singulating the wafer substrate into individual semiconductor devices which are encapsulated and packaged.

What is claimed is:

1. A method of testing an integrated circuit device for buried insulator defects, comprising:
   forming a test circuit in the integrated circuit device comprising a dedicated ground bias pad connected across a high voltage electrostatic discharge clamp circuit to a well-driving ground pad, where the dedicated ground bias pad is electrically connected only to a wafer substrate in the integrated circuit device through a conductive structure in a deep trench isolation structure and is not connected to any other circuitry on the integrated circuit device, and where the well-driving ground pad is electrically connected to a well region in the integrated circuit device;
   applying a first voltage to the dedicated ground bias pad to bias the wafer substrate while simultaneously applying a second voltage to the well-driving ground pad to bias the well region, where the first and second voltages create a stressing voltage across a buried insulator layer in the integrated circuit device; and
   conducting a screening test to screen for a defect in the buried insulator layer by measuring a leakage current at the well-driving ground pad or dedicated ground bias pad.

2. The method of claim 1, further comprising shorting the dedicated ground bias pad to the well-driving ground pad after conducting the test.

3. The method of claim 1, where forming the test circuit comprises forming a single well-driving ground pad that is electrically connected to the well region directly or through one or more semiconductor devices formed on a surface of the well region.

4. The method of claim 1, where the stressing voltage is greater than an absolute maximum rating of an application specification for the integrated circuit device and is lower than a breakdown voltage of the buried insulator layer.

5. The method of claim 4, wherein at least one of: applying the first voltage comprises applying a negative voltage of at least –40V to the dedicated ground bias pad to bias the wafer substrate; and applying the second voltage comprises applying a voltage between approximately +5V and –5V to the well-driving ground pad to bias the well region.

6. The method of claim 1, where conducting the screening test comprises measuring the leakage current at the well-driving ground pad to screen for a defect in a buried insulator layer formed between the wafer substrate and the well region.

7. The method of claim 1, where conducting the screening test comprises measuring the leakage current at the well-driving ground pad to screen for a defect in an insulator liner layer formed between the conductive structure in the deep trench isolation structure and the well region.

8. A device comprising:
   a semiconductor-on-insulator substrate comprising device regions disposed at a surface of the SOI substrate and isolated from one another by deep trench isolation structures which extend from the surface of the SOI substrate to an underlying semiconductor substrate separated from the SOI substrate by a first buried insulator layer;
   a first set of semiconductor devices formed on the surface of the SOI substrate in each device region; and
   a test circuit portal supported by the SOI substrate comprising a dedicated semiconductor substrate bias terminal connected across a high voltage electrostatic discharge clamp circuit to one or more ground terminals,
   where the dedicated semiconductor substrate bias terminal is electrically connected to the semiconductor substrate through at least one conductive structure in the deep trench isolation structures, and
   where the one or more ground terminals are electrically connected to the device regions in the SOI substrate, either directly or through the first set of semiconductor devices.

9. The device of claim 8, wherein the test circuit portal comprises:
   a first conductive interconnect path that electrically connects the semiconductor substrate to the dedicated semiconductor substrate bias terminal; and
   a second conductive interconnect path that electrically connects the device regions to the one or more ground terminals.

10. The device of claim 9, wherein the first buried insulator layer comprises at least one of: a buried insulator layer formed between the semiconductor substrate and the SOI substrate where the device regions are disposed; and an insulator liner layer formed between a first conductive structure in a first deep trench isolation structure and the SOI substrate where the device regions are formed.

11. The device of claim 9, wherein the high voltage electrostatic discharge clamp circuit comprises a combination of transistors and diodes that provides a protection against electrostatic discharges for the first set of semiconductor devices formed on the surface of the SOI substrate.

12. The device of claim 9, further comprising a conductive path which forms an electrical short between the dedicated semiconductor substrate bias terminal and the one or more ground terminals.

13. The device of claim 9, where a first voltage supplied to the dedicated semiconductor substrate bias terminal by a first external probe biases the semiconductor substrate and where a second voltage supplied to the one or more ground terminals by a second external probe biases the SOI substrate to create a strong stressing voltage across the first buried insulator layer in the device that is greater than an absolute maximum rating of an application specification for the device and that generates a leakage current that can be measured at the one or more ground terminals to detect a defect in the first buried insulator layer.

14. The device of claim 9, where the high voltage electrostatic discharge clamp circuit comprises a 65V+ electrostatic discharge clamp.

15. The device of claim 8, wherein the first buried insulator layer comprises at least one of: a buried insulator layer formed between the semiconductor substrate and the SOI substrate where the device regions are disposed; and an insulator liner layer formed between a first conductive structure in a first deep trench isolation structure and the SOI substrate where the device regions are formed.

16. The device of claim 8, wherein the high voltage electrostatic discharge clamp circuit comprises a combination of transistors and diodes that provides a protection against electrostatic discharges for the first set of semiconductor devices formed on the surface of the SOI substrate.

17. The device of claim 8, further comprising a conductive path which forms an electrical short between the dedicated semiconductor substrate bias terminal and the one or more ground terminals.

18. The device of claim 8, where a first voltage supplied to the dedicated semiconductor substrate bias terminal by a first external probe biases the semiconductor substrate and where a second voltage supplied to the one or more ground terminals by a second external probe biases the SOI substrate to create a strong stressing voltage across the first buried insulator layer in the device that is greater than an absolute maximum rating of an application specification for the device and that generates a leakage current that can be measured at the one or more ground terminals to detect a defect in the first buried insulator layer.

19. The device of claim 8, where the high voltage electrostatic discharge clamp circuit comprises a 65V+ electrostatic discharge clamp.

20. The device of claim 8, where the high voltage electrostatic discharge clamp circuit protects buried insulator layers in the device against electrical stresses by discharging electrostatic discharges between the dedicated semiconductor substrate bias terminal and the one or more ground terminals.

* * * * *